US006781887B2

(12) United States Patent
Gelsomini et al.

(10) Patent No.: US 6,781,887 B2
(45) Date of Patent: Aug. 24, 2004

(54) ANTI-FUSE STRUCTURE AND METHOD OF WRITING AND READING IN INTEGRATED CIRCUITS

(75) Inventors: Tito Gelsomini, Plano, TX (US); Kemal Tamer San, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/455,579

(22) Filed: Jun. 5, 2003

(65) Prior Publication Data

US 2003/0207526 A1 Nov. 6, 2003

Related U.S. Application Data

(62) Division of application No. 09/873,035, filed on Jun. 2, 2001, now Pat. No. 6,611,040.

(51) Int. Cl.[7] .............................................. G11C 16/04
(52) U.S. Cl. .............................. 365/189.01; 365/189.12
(58) Field of Search ........................ 365/189.01, 189.12

(56) References Cited

U.S. PATENT DOCUMENTS

6,462,998 B1 * 10/2002 Proebsting .................. 365/205
6,611,040 B2 * 8/2003 Gelsomini et al. ..... 365/189.01

* cited by examiner

Primary Examiner—Van Thu Nguyen
Assistant Examiner—Tuan T. Nguyen
(74) Attorney, Agent, or Firm—W. James Brady, III; Frederick J. Telecky, Jr.

(57) ABSTRACT

An information write-register embedded in an integrated circuit (IC) is made of a plurality of independently addressable gate-controlled components formed in an isolated p-well nested in a n-well. Gates over the p-well are positioned on an insulator geometrically formed so that it is susceptible locally to electrical conductivity upon applying an overstress voltage pulse, whereby binary information can be permanently encoded into the write-register. The overstress voltage pulse is applied between the gate and the p-well and is created when a write-enable pulse of predetermined polarity and duration is superposed by a p-well pulse of opposite polarity and shorter duration.

6 Claims, 3 Drawing Sheets

ANTI-FUSE STRUCTURE AND METHOD OF WRITING AND READING IN INTEGRATED CIRCUITS

This application is a division of Ser. No. 09/873,035 filed on Jun. 2, 2001 now U.S. Pat. No. 6,611,040.

FIELD OF THE INVENTION

The present invention is related in general to the field of semiconductor devices and processes and more specifically to integrated circuits structure, fabrication and operation as they relate to data writing and reading.

DESCRIPTION OF THE RELATED ART

Cutting through a thin film of metal or doped polycrystalline semiconductor by laser pulses has been practiced for many years as a method of irreversibly opening electrical fuses. A well-known example is the repair of memory integrated circuits (IC) based on available redundant building blocks. Another example, the reading of electrical data stored in an information unit associated with ICs, is described in U.S. patent application Ser. No. 60/094,097, filed on Jul. 24, 1998 (Gelsomini et al., "Integrated Circuit Wireless Tagging").

The method, however, of opening metal fuses by laser pulses is expensive. It requires extra process steps and expensive laser equipment in device fabrication. Furthermore, the silicon real estate needed for the layout of the metal fuses is substantial. Most important, opening fuses by laser pulses is very expensive for writing information. The semiconductor industry has, therefore, considered the approach of anti-fuses. It is a circuit element that is normally open circuited until it is programmed, at which point the anti-fuse assumes a relatively low resistance. Anti-fuses are commonly used to selectively enable certain features of ICs and to perform repairs by replacing defective portions with redundant circuits.

Conventional anti-fuses are similar in construction to capacitors; they have a pair of conductive plates separated from each other by a dielectric such as oxide or nitride. The dielectric is changed into a conductive regime by applying a differential voltage between the plates that is sufficient to break down the dielectric, thereby allowing for electrical connection between the plates. Typically this high programming voltage is applied to the IC externally. It is a disadvantage of anti-fuses that the programmed resistance may vary over a considerable range and is often far higher than desired. Further, the magnitude of the programming voltage that can be applied to the anti-fuses is severely limited by the presence of other circuitry.

An example for using anti-fuses is given in U.S. Pat. No. 4,590,589, issued on May 20, 1986 (Gerzberg, "Electrically Programmable Read-only Memory"). The anti-fuse described is normally nonconductive until a sufficient voltage is applied across the anti-fuse to lower the resistance thereof and become conductive. The anti-fuse can comprise a portion of an n-type silicon substrate with an implanted region formed in a surface region by the introduction of p-type ions. The implanted ions disrupt the crystalline structure of the substrate and the disrupted crystalline structure increases the resistance between the implanted region and the substrate. By applying a sufficient voltage across the implanted region, the crystalline state of the region is reinstated and the resistance thereof drops appreciably. After removing the voltage, the disrupted state is restored only partially or insufficiently for a repeat operation.

The anti-fuse as described above has been applied in U.S. Pat. No. 5,799,080, issued on Aug. 25, 1998 (Padmanabhan et al., "Semiconductor Chip Having Identification/ Encryption Code") to provide a code mechanism in an IC for identifying the IC or for enabling the IC. However, the code is readily accessible for interrogation and enablement only once. Alternatively, the code can be reprogrammed by use of an electrically erasable field effect transistor.

U.S. Pat. No. 5,844,298, issued on Dec. 1, 1998 (Smith et al., "Method and Apparatus for Programming Anti-Fuses") describes a programming circuit for anti-fuses fabricated in the same IC. Relatively large (positive) programming voltages are applied from the outside so that relatively elaborate circuitry is needed to protect gate oxide layers in MOSFETs of the IC from damage.

U.S. patent application Ser. No. 60/160,409 has been filed on Oct. 19, 1999 (Gelsomini, "Chip Identifier and Method of Fabrication"). That application, to which the present invention is related, describes an information write-register embedded in an integrated circuit. The register is made of a plurality of gate-controlled MOS transistors or capacitors having a gate insulator geometry locally susceptible to electrical conductivity upon applying overstress voltage pulses, whereby information can be permanently encoded into the write-register. In order to supply the pulses selectively to the component gates, a plurality of level shifters, also embedded in the integrated circuit, outputs the pulses on the basis of inputs received from stored data and enable commands.

Although this patent application is a significant advancement over the known technology of programming by blowing metal fuses with laser machines—an expensive and area-consuming method—, it still requires IC devices suitable for handling relatively high voltages, and all the extra process steps required for manufacturing these devices. An urgent need has therefore arisen to conceive a concept for a low-cost, yet high performance method of encoding anti-fuses in ICs to allow data storing. Preferably, this method should be based on fundamental design concepts flexible enough to be applied for different semiconductor product families and a wide spectrum of process and assembly variations. No extra process steps should be required. The method should not only meet high electrical and information performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

An information write-register embedded in an integrated circuit (IC) is made of a plurality of independently addressable gate-controlled components formed in an isolated p-well nested in an isolated n-well. Gates over the p-well are positioned on an insulator geometrically formed so that it is susceptible locally to electrical conductivity upon applying an overstress voltage pulse, whereby binary information can be permanently encoded into the write-register. The overstress voltage pulse is applied between the gate and the p-well and is created when a write-enable pulse of predetermined polarity and duration is superposed by a p-well pulse of opposite polarity and shorter duration.

The present invention is related to ICs of any kind, especially those having high density and high value. These ICs can be found in many semiconductor device families such as processors, digital and analog devices, memory and logic devices, high frequency and high power devices, specifically in large area chip categories. The invention offers an inexpensive way to permanently write into, and store, a coded individual identification as well as manufacturing and engineering data. Examples include wafer lot number, wafer number, chip location on the wafer, test results, electrical and functional characteristics, and so on. The writing can be performed at the wafer level, or after packaging of the unit.

It is an aspect of the invention to offer desirable features to both the manufacturer and the user:

Data writing and reading: Individual wafer level engineering data can be stored and then retrieved at any time, even after chip assembly and packaging. Parametric and functional performance data measured at wafer level can be compared to final test data after assembly—a necessity in manufacturing science for cost-conscious process development.

Anti-theft coding: Permanently recording the producer, date of production, country of origin, user ID, is a significant crime deterrent.

ISO 9000 requirements: Permanent chip identification is desired in qualification.

Military requirements: Permanent identification of manufacturer and country of origin.

User's data: Inputs for personal interest of the user.

Another aspect of the invention is to require no extra process steps and no extra equipment, and also to operate at high speed so that no extra cost is added to the manufacturing.

Another aspect of the invention is to be conservative with real estate requirements, especially to require not more silicon area for the components (commonly MOS transistors) to be programmed than for standard metal or polysilicon fuses.

Another aspect of the invention is to provide reading of the information by sensing (with the use of sense amplifiers) the electrical status of the components, and loading their logic content into a shift register. The different electrical characteristics of the MOS transistors which have been programmed can be detected by sensing the voltage of a specific line of, the information write-register.

Another aspect of the invention is to provide means for identifying and handling redundancy of rows or columns, and for selecting certain circuit portions over others (so-called "trimming"). This capability is based on the fact s that the electrical status of MOS transistor insulators is equivalent to the electrical status of conventional metal or polysilicon fuses.

Another aspect of the present invention is to design the information write-register so that the information can be encoded in a data bank while the chip is still in wafer form, as well as after its singulation. This aspect is achieved by providing a plurality of electrical anti-fuses in the data bank, which can be irreversibly transformed into the conductive state by applying overstress voltage pulses.

Another aspect of the invention is to design the information write-register, write-control logic, and read-control logic such that their fabrication is flexible and can be adopted to the most commonly used and accepted IC fabrication processes.

These aspects have been achieved by the teachings of the invention concerning design concepts and process flows suitable for mass production. Various modifications have been successfully employed to satisfy different selections of product design and processes.

In the first embodiment of the invention, gate oxide anti-fuses are used in circuits for write-control and write-control logic including information register; the circuits also have read-control and read-control logic. Gate oxide anti-fuses have gate insulators made of silicon dioxide in a thickness range from about 2 to 10 nm. These oxides can be locally transformed into the conductive state by pulses in the range from 6 to 10 V and 10 to 50 $\mu$s duration.

In the second embodiment of the invention, the circuit of a redundancy or trimming module is described, consisting of write-control and write-control logic, and rows/columns redundancy logic, or trimming logic.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
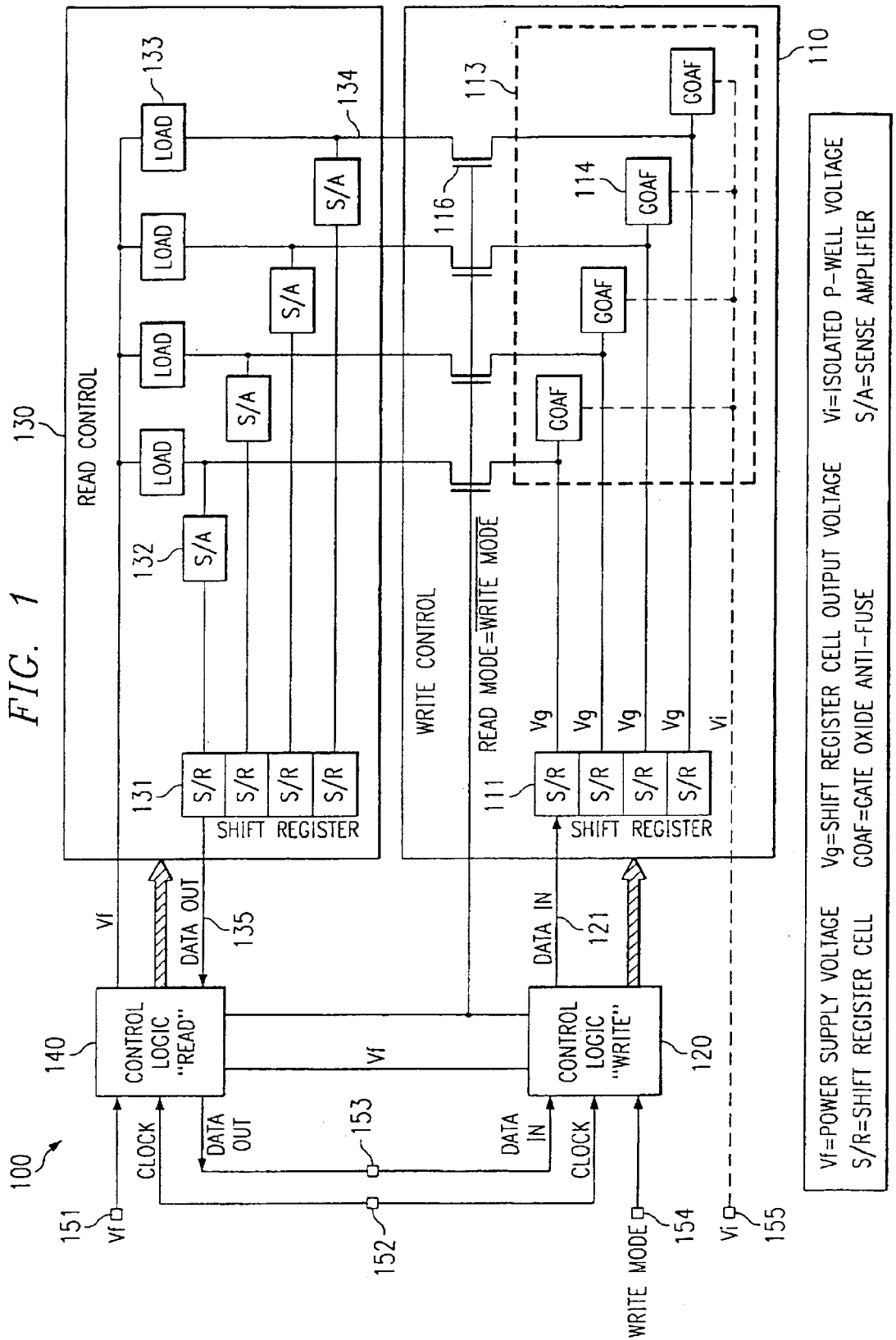
FIG. 1 is a schematic block diagram of the first embodiment of the invention, the integrated circuit chip identifier module including the write-control with information write-register, and read control.

The main concept of the invention is shown in FIG. 1. It is a schematic block diagram of the writing and reading modules, the "Write/Read Module" WRM generally designated 100, which are parts of the integrated circuit (IC) of the chip and are fabricated concurrently with the IC into the semiconductor substrate. The major units of module 100 are the write-control unit 110, which is under the direction of the write-control logic unit 120; the read-control unit 130, which is under the direction of read-control unit 140; and a plurality of input/output pads. Included in these pads are the power supply voltage 151, commonly referred to as Vf; the clock signal 152; the pad 153 for data in and data out; the write-mode pad 154; and the writing voltage 155, also called the isolated p-well voltage and commonly referred to as Vi. Vi is preferably in the −4 to −5 V range and provides a portion of the overstress voltage pulses to be used for information encoding.

As long as Vf is supplied to write-control logic unit 120, and the write-mode signal is active (=ground), the input data 153 can pass the write-control logic and proceed to shift register 111 as "Data In" (121 in FIG. 1). This information is synchronized by the clock imbedded the arrow shown dashed in FIG. 1 (the arrow symbolizes the connection between the control logic "write" 120 and the write control module 110) and stored as a code in shift register cells 111, forming a sequence of "logic 0" and "logic 1". While the signal write mode is active, both control logic "read" and read control are not powered.

Of pivotal importance to the present invention is the information write-register 113. It provides a plurality of independently addressable components 114, which are integrated into write-control unit 110 and thus the overall IC. Each component 114 is formed as an isolated p-well nested in an isolated n-well (more detail in FIGS. 2 and 3). Each component is connected to the output of a shift register 111 and thus individually addressable from each of its cells. Each component 114 is further connected to Vi, supplied from the pad 155 so that it can receive the p-well voltage pulse (described below and in FIG. 4).

In FIG. 1, the write-register components 114 are marked "GOAF" to highlight their structure as "gate oxide anti-fuses". As described in more detail in FIGS. 2 and 3, the gate of the components is positioned on an insulator which is geometrically formed so that it is susceptible locally to electrical conductivity, when an overstress voltage pulse is applied to the gate. By locally inverting the insulating character of the gate insulator, binary information can be permanently encoded into the write-register component (GOAF).

The different electrical characteristics of the GOAFs (those that have been stressed from those that have not been stressed) can be detected by sensing the voltage of a specific line of the WRM:

If the voltage value is close to the substrate voltage (ground=0 V), then the GOAF was purposely altered; this voltage level is associated with a logic "0".

If the voltage value is the supply voltage Vf of the Read Control block, then the GOAF is intact; this voltage level is associated with a logic "1".

As FIG. 1 indicates, the "Read-Mode" is the inverse of the "Write Mode". Consequently, the "read" function is activated when the write mode signal is not active (=Vf).

The purpose of the "read" function is to sense the electrical status of each individual GOAF 114 in the write-register 113 and to load the logic content of the GOAFs into the shift register cells 131 of the read control unit 130. After completion of the "read" function, the content of the shift register cells 131 of the read-control unit should match with the content of the shift register cells 111 of the write-control unit, which was loaded with the Data In 121 at the beginning of the "write" function. Sense amplifiers 132 are connected to the line 135.

The sequence of the "read" function is as follows.

Applying Vf=Vdd to the power supply pad 151 in FIG. 1; applying Vi=substrate=0 V. Applying signal at pad 154 for "read" mode. The "read" blocks are powered and transistors 116 are "on".

Applying clock 152; the "read" function starts.

Sense amplifiers 132 transfer to their respective shift register cells 131 the status being sensed:

Vf, corresponding to "logic 1", if the line 134 from load 133 to GOAF 114 (gate terminal) is isolated from the substrate;

ground, corresponding to "logic 0", if the line 134 from load 133 to GOAF 114 (gate terminal) is shorted to substrate.

Content of shift register 131 will flow as Data Out (135 in FIG. 1) to the read-control logic 140 to the input/output pad 153.

Figure 2:
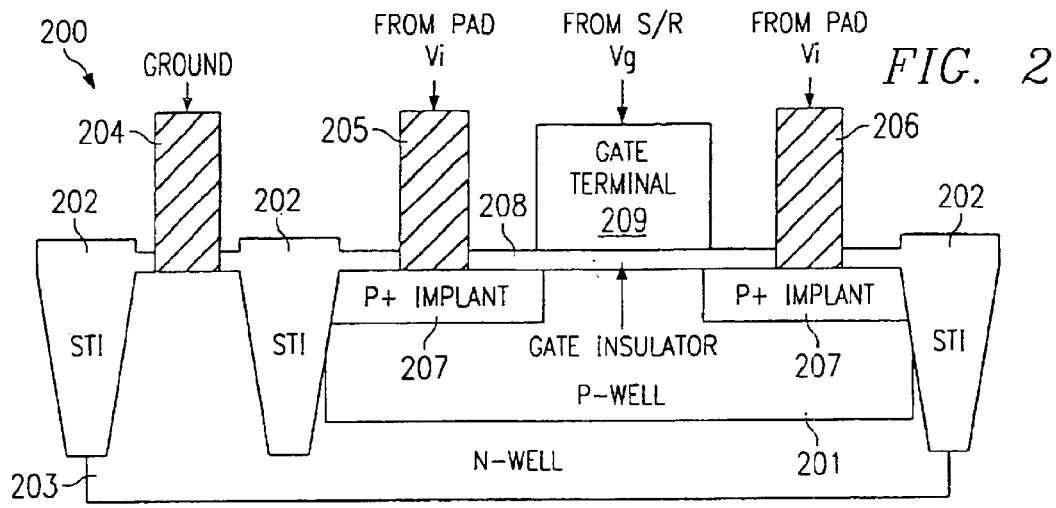
FIG. 2 is a schematic and simplified cross section of a gate oxide anti-fuse used in the write-register of the write-control.

FIG. 2 illustrates schematically the structure of a gate oxide anti-fuse (GOAF), generally designated 200, according to the present invention. In principle, the GOAF is an isolated well structure, specifically an isolated p-well. The p-well 201 is contained in the shallow trench isolation (STI) 202 within isolated n-well. Such isolated p-wells are readily available in the manufacturing technologies of Flash and Analog devices and can also be formed in CMOS technologies using regular CMOS p- and n-implants (as used, for instance, for fabricating Vt, punch-through, channel stop and well structures). For the present invention, the requirement is that the n-well layer 203 should be designed bigger than the p-well so that the n-well fully surrounds the p-well to form an isolated p-well.

Figure 3:
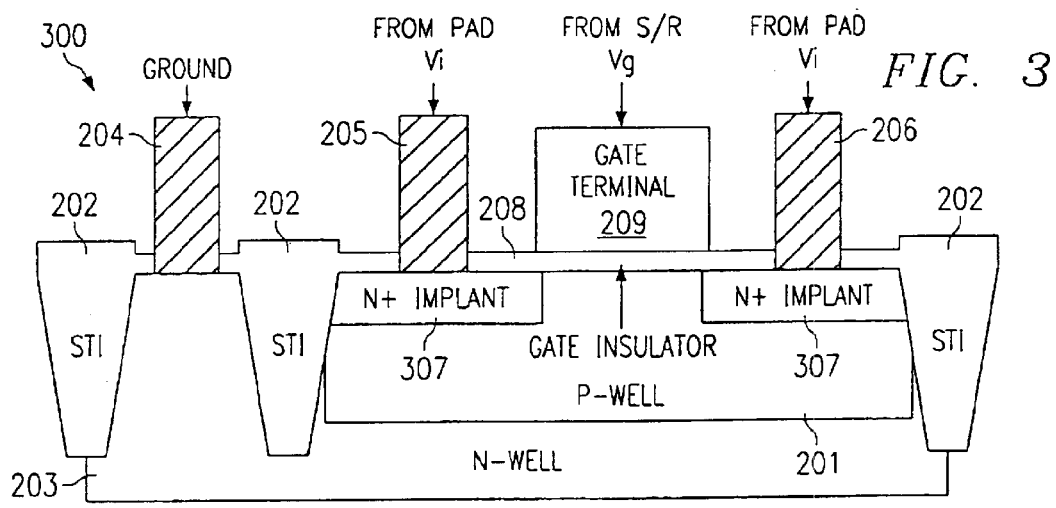
FIG. 3 is a schematic and simplified cross section of a transistor-like gate oxide anti-fuse used in the write-register of the write-control.

FIG. 2 further indicates the ground contact 204 to the n-well and the two Vi contacts 205 and 206 of the p-well. In FIG. 2, contacts 205 and 206 are formed on p+ implants 207 into p-well 201. Slightly varying this concept, FIG. 3 shows the contacts 205 and 206 formed on n+ implants 307 into p-well 201. This variation results in a transistor-like gate oxide anti-fuse, as depicted in FIG. 3 and generally designated 300. In the commonly practiced silicon device technologies, the breakdown of the isolated p-well structure is considerably above the operating bias and does not happen until well in excess of −7 V.

Of key importance to the present invention is the gate insulator layer 208 which covers the p-well between the contact implants 207 or 307. This gate insulator is selected from a group consisting of silicon dioxide, perovskite or other insulating material in the thickness range from about 2 to 10 nm. On top the surface of the gate insulator is the gate terminal 209, made of poly-silicon or other conductive material.

The material, thickness or other geometrical properties of gate insulator 208 are selected so that an overstress voltage in the range from about 8 to 10 V, applied for about 7 to 40 μs between gate terminal 209 and p-well 201, can locally invert the insulating character of the gate insulator. Consequently, the gate insulator 208 becomes locally susceptible to electrical conductivity. This transformation is used to permanently encode binary information into the GOAF.

Figure 4:
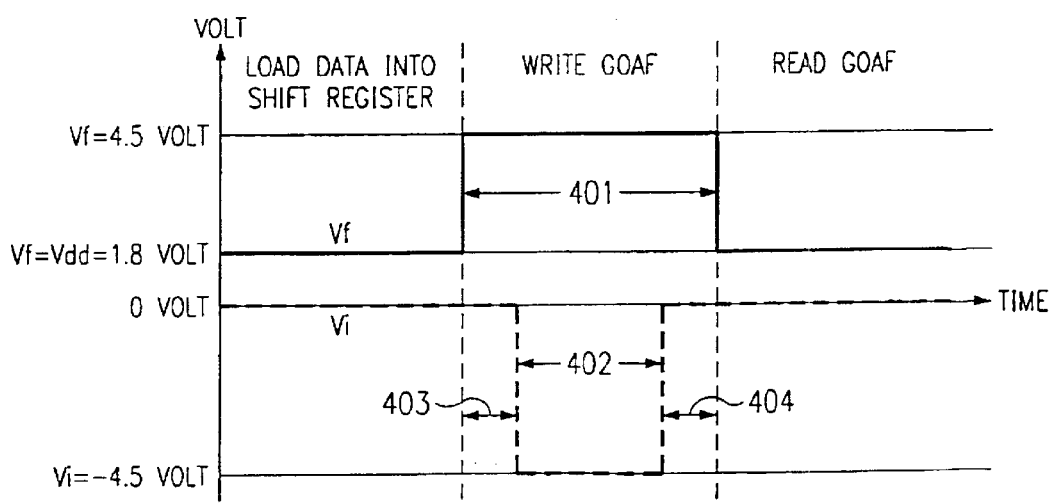
FIG. 4 is a schematic diagram plotting voltage versus time, illustrating the polarities and durations of the write-enable pulse and the p-well pulse.

In FIG. 4, the write operation is displayed as a graph of voltage versus time. In conjunction with FIG. 1, the sequence for encoding the information write-register 113, which contains the plurality of GOAFs 114, comprises the steps of:

Applying Vf=Vdd=1.8 V at the power supply pad 151 of the WRM;

Applying Vi=ground=0 V to the p-well pad 155. It should be emphasized that the voltage Vi is connected from the pad straight to the p-well by a direct metal line (i.e., there are no transistors or other devices on this Vi-path);

Placing substrate at ground potential (0 V).

Powering the control logic "write" block 120.

The "write mode" command is applied at pad 154:

Powering write control module 110 in standby mode;

Applying clock 152; the "write" procedure starts;

Activating shift register 111 of the write control module 110;

Data start flowing from data pad 153, loading the shift register 111; the output of the shift register cells 111 are either at Vf=Vdd, or at ground, depending on their binary content. These outputs represent the sequence of the binary data loaded into the shift register 111. The output of the shift register cells are connected to the gate terminals (209 in FIGS. 2 and 3) of the GOAFs.

Applying Vf=+4.5 V as pulse of 10 to 50 μs duration (designated 401 in FIG. 4);

After a time delay of about 1 μs (designated 403 in FIG. 4), applying Vi=−Vf=−4.5 V as pulse of 7 to 40 μs duration (designated 402 in FIG. 4). Vi is applied directly from pad 155 to p-well. Pulse Vi is terminated a short time (about 1 $\mu$s, see 404 in FIG. 4) before the end of pulse Vf. The superposed pulses Vf and Vi have the following effects in the GOAFs:

All GOAFs which have their gate terminals 209 at Vf=ground potential, are unchanged by the Vi pulse, since the voltage across their gate insulator is below the minimum value for electrical damage.

All GOAFs which have their gate terminals 209 at Vf=+4.5 V, have the insulating character of their gate insulator layer locally inverted to electrical conductivity, since the absolute sum of the voltages across their gate insulator and the energy and time of the pulses are above the maximum value for electrical damage. Consequently, an electrically conductive path is created from gate 209 to p-well 201. This act represents the "writing" of the information. As a consequence, the respective line 134 of the read control unit has an electrically conductive path to the substrate; otherwise, this path does not exist. This fact represents the "reading" of the information.

Figure 5:
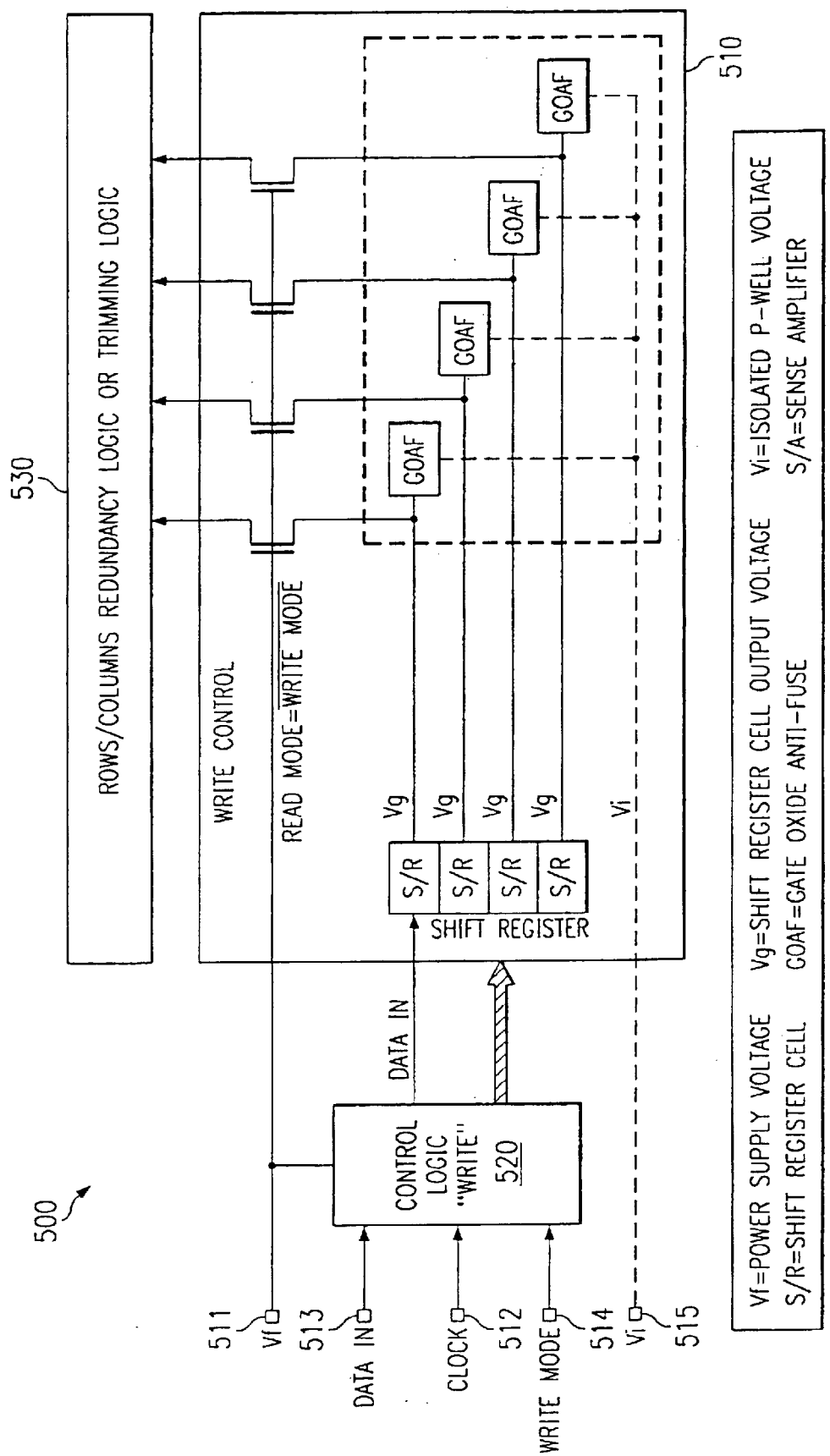
FIG. 5 is a schematic block diagram of the second embodiment of the invention, the integrated circuit redundancy and trimming module.

The concept of the second embodiment of the invention is shown in FIG. 5. It represents the schematic block diagram of a redundancy or "trimming" module, which is needed in many semiconductor device applications. It is generally designated 500. The major units of the module are the write-control unit 510, which is under the direction of the write-control logic unit 520. Both units are constructed and operational analogous to the respective units in FIG. 1. FIG. 5 further shows rows/columns redundancy logic, or, alternatively, trimming logic, 530, as well as a plurality of input/output pads. Included in these pads are the power supply voltage 511, commonly referred to as Vf; the clock signals 512; the pad 513 for data in; the write-enable pad 514; and the writing voltage 515, commonly referred to as Vi. Vi is preferably in the −4 to −5 V range and provides the overstress voltage pulses to be used for the redundancy or trimming operations.

The write-control unit 510 is designed according to the rules specific for the device type to be served, and it is fabricated according to the technology employed by that device type.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the gate oxide to be exposed to overstress voltage pulses may be constructed of silicon dioxide, silicon oxynitride, HSQ or organic insulator materials, and the thicknesses may be selected according to the chosen dielectric material. It is therefore intended that the appended claims encompass any such modifications or embodiments.

We claim:

1. A method for encoding data into the write-register of an integrated circuit having a plurality of components including a gate-controlled insulator over an isolated p-well, comprising the steps of:

applying an overstress voltage pulse between said component gate and said isolated p-well, thereby locally inverting the insulating character of said gate insulator, to permanently encode binary data into said write-register; and controlling said pulses by superposing a write-enable pulse of predetermined polarity and duration with a p-well pulse of opposite polarity and shorter duration.

2. The method according to claim 1 wherein the step of controlling said pulses by superposing said write-enable pulse and said p-well pulse includes the steps of:

loading the data, to be encoded in said write-register, into the shift register associated with said write-register;

initiating the write-enable voltage pulse by increasing the power supply voltage to a predetermined value;

after a time delay of about 1 $\mu$s, initiating directly from the user said p-well voltage pulse, said p-well pulse having a polarity opposite to the polarity of said write-enable voltage pulse and a magnitude such that the absolute voltage sum of said p-well pulse and said write-enable pulse is sufficient to locally invert the insulating character of said gate insulator;

after a time duration sufficient to locally invert said insulating character to electrical conductivity, discontinuing said p-well pulse; and after a delay of about 1 $\mu$s, discontinuing said write-enable pulse.

3. The method according to claim 1 wherein locally inverting said gate insulator by an overstress voltage pulse encodes the first binary digit as a "logic 0" in said component.

4. The method according to claim 1 wherein preserving said insulating character of said gate insulator encodes the second binary digit as a "logic 1" in said component.

5. The method according to claim 1 wherein said overstress pulses are applied while said integrated circuit is still portion of a semiconductor wafer.

6. The method according to claim 1 wherein said overstress pulses are also applied after said integrated circuit has been singulated from said wafer, assembled and packaged.

* * * * *